United States Patent
Son

(10) Patent No.: US 9,202,886 B2
(45) Date of Patent: Dec. 1, 2015

(54) METHOD FOR FABRICATING A SCHOTTKY DIODE INCLUDING A GUARD RING OVERLAPPING AN INSOLATION LAYER

(71) Applicant: Jin-Yeong Son, Chungcheongbuk-do (KR)

(72) Inventor: Jin-Yeong Son, Chungcheongbuk-do (KR)

(73) Assignee: MAGNACHIP SEMICONDUCTOR, LTD., Chungcheongbuk-Do (KR)

( * ) Notice: Subject to any disclaimer, the term of this patent is extended or adjusted under 35 U.S.C. 154(b) by 0 days.

(21) Appl. No.: 14/454,666

(22) Filed: Aug. 7, 2014

(65) Prior Publication Data
US 2014/0349470 A1  Nov. 27, 2014

Related U.S. Application Data

(62) Division of application No. 12/897,753, filed on Oct. 4, 2010, now Pat. No. 8,884,395.

(30) Foreign Application Priority Data

Mar. 26, 2010 (KR) .................. 10-2010-0027059

(51) Int. Cl.
  *H01L 21/28* (2006.01)
  *H01L 29/66* (2006.01)
  *H01L 29/06* (2006.01)
  *H01L 29/872* (2006.01)
  *H01L 21/265* (2006.01)

(52) U.S. Cl.
  CPC ........ *H01L 29/66143* (2013.01); *H01L 21/265* (2013.01); *H01L 29/0692* (2013.01); *H01L 29/872* (2013.01); *H01L 21/26513* (2013.01)

(58) Field of Classification Search
  CPC .............. H01L 29/872; H01L 29/0692; H01L 29/66143; H01L 29/0619; H01L 29/66212
  USPC .................. 257/471, 475, 476, 484, E29.338, 257/E21.473, E29.359; 438/527, 570
  See application file for complete search history.

(56) References Cited

U.S. PATENT DOCUMENTS

| | | | |
|---|---|---|---|
| 5,418,185 A | 5/1995 | Todd et al. | |
| 6,096,618 A * | 8/2000 | Dunn et al. | 438/328 |
| 2006/0244050 A1 * | 11/2006 | Sudou | 257/324 |
| 2008/0006899 A1 * | 1/2008 | Kim et al. | 257/476 |
| 2008/0067623 A1 * | 3/2008 | Coolbaugh et al. | 257/471 |
| 2009/0065888 A1 | 3/2009 | Kato et al. | |
| 2009/0243027 A1 | 10/2009 | Kato et al. | |
| 2009/0283841 A1 * | 11/2009 | Yeh et al. | 257/384 |
| 2009/0294865 A1 * | 12/2009 | Tang et al. | 257/369 |
| 2010/0200945 A1 * | 8/2010 | Kim et al. | 257/471 |

FOREIGN PATENT DOCUMENTS

| | | |
|---|---|---|
| KR | 100763848 B1 | 9/2007 |
| KR | 1020090026047 A | 3/2009 |

* cited by examiner

*Primary Examiner* — Khiem D Nguyen
(74) *Attorney, Agent, or Firm* — Blakely Sokoloff Taylor & Zafman LLP

(57) ABSTRACT

A Schottky diode includes a deep well formed in a substrate, an isolation layer formed in the substrate, a first conductive type guard ring formed in the deep well along an outer sidewall of the isolation layer and located at a left side of the isolation layer, a second conductive type well formed in the deep well along the outer sidewall of the isolation layer and located at a right side of the isolation layer, an anode electrode formed over the substrate and coupled to the deep well and the guard ring, and a cathode electrode formed over the substrate and coupled to the well. A part of the guard ring overlaps the isolation layer.

17 Claims, 16 Drawing Sheets

(A)

(B)

(FIRST PRIOR ART)  (SECOND PRIOR ART)

(FIRST PRIOR ART)    (SECOND PRIOR ART)

METHOD FOR FABRICATING A SCHOTTKY DIODE INCLUDING A GUARD RING OVERLAPPING AN INSOLATION LAYER

CROSS-REFERENCE TO RELATED APPLICATIONS

The present application claims priority of Korean Patent Application No. 10-2010-0027059, filed on Mar. 26, 2010, which is incorporated herein by reference in its entirety.

BACKGROUND OF THE INVENTION

Exemplary embodiments of the present invention relate to a technology of fabricating a semiconductor device, and more particularly, to a Schottky diode and a method for fabricating the same.

A Schottky diode mainly used as a switching element or a rectification element in a semiconductor device uses a metal-semiconductor junction and has superior high speed switching characteristics as compared with a general PN junction diode. This is because minority carrier injection (MCI) does not occur when a forward voltage is applied to the Schottky diode, differently from the PN junction diode. In the case of the Schottky diode, a current flows by majority carriers instead of minority carriers. Therefore, the Schottky diode has an advantage that a reverse recovery time is very short because there is no accumulation effect. However, the Schottky diode has a disadvantage that it is difficult to control a high current (or a high voltage) because a current flows by majority carriers. In this regard, recently, a Schottky diode is extensively used, which includes a guard ring in order to achieve high speed switching characteristics and simultaneously control a large current.

FIG. 1 is a cross-sectional view illustrating a Schottky diode in accordance with a first prior art, and FIGS. 2A and 2B are diagrams illustrating the problem of the Schottky diode in accordance with the first prior art.

Hereinafter, the Schottky diode in accordance with the first prior art will be described with reference to FIG. 1. The Schottky diode includes an N type deep well 12 formed in a substrate 11, an isolation layer 22 formed in the substrate 11, an N type well 16, a cathode electrode 17 coupled to the well 16, a P type guard ring 20, and an anode electrode 21 coupled to the deep well 12 and the guard ring 20. The N type well 16 is formed in the deep well 12 and is located at the right side of the isolation layer 22. The guard ring 20 is formed in the deep well 12 and is located at the left side of the isolation layer 22 while being spaced apart from the isolation layer 22 by a predetermined interval. The guard ring 20 includes a P-type first impurity region 19 formed on the surface of the substrate 11, and a P-type second impurity region 18 formed under the P-type first impurity region 19 having an impurity doping concentration lower than that of the first impurity region 19.

As indicated by reference numeral A of FIG. 1, which illustrates the Schottky diode in accordance with the first prior art, and reference numeral A of FIG. 2A which is a simulation image illustrating stress concentration, since the guard ring 20 is spaced apart from the isolation layer 22 by the predetermined interval, it is problematic in that stress is concentrated between the isolation layer 22 and the guard ring 20. When the stress is concentrated between the isolation layer 22 and the guard ring 20, a leakage current may easily flow through a stress concentration point. In the case of fabricating the Schottky diode in accordance with the first prior art, it may be difficult to control the interval between the isolation layer 22 and the guard ring 20, large variation in a leakage current value may occur according to dies/wafers or dies/lots.

Furthermore, as indicated by reference numeral B of FIG. 1, which illustrates the Schottky diode in accordance with the first prior art, and the graph of FIG. 2B which illustrates a reverse bias current (that is, a leakage current) according to dies on a wafer, the guard ring 20 includes the first impurity region 19 having an impurity doping concentration very higher than that of the deep well 12, the leakage current due to the big difference between the impurity doping concentrations of the deep well 12 and the first impurity region 19 may occur. In relation to the leakage current, large variation in the leakage current value may occur according to dies/wafers. In addition, due to the big difference between the impurity doping concentrations of the deep well 12 and the first impurity region 19, a breakdown voltage of the Schottky diode, that is, the ability of withstanding a high voltage (or a high current) may be reduced. For reference, (A) of FIG. 2B is a diagram illustrating the position of dies on a wafer and (B) of FIG. 2B is a current-voltage graph illustrating a leakage current generated in each die when a reverse bias is applied to the Schottky diode in accordance with the first prior art.

In order to solve the above problems in accordance with the first prior art, a Schottky diode in accordance with a second prior art has been proposed.

FIG. 3 is a cross-sectional view illustrating the Schottky diode in accordance with the second prior art.

Hereinafter, the Schottky diode in accordance with the second prior art will be described with reference to FIG. 3. The Schottky diode includes an N type deep well 32 formed in a substrate 31, an isolation layer 42 formed in the substrate 31, an N well 36, a cathode electrode 37 coupled to the well 36, a P well 40, and an anode electrode 41 coupled to the deep well 32 and the P well 40. The N well 36 is formed in the deep well 32 and is located at the right side of the isolation layer 42. The P well 40 is formed in the deep well 32 and is located at the left side of the isolation layer 42 while being in contact with the N well 36 and the isolation layer 42. The P well 40 serves as a guard ring, and has an impurity doping concentration lower than that of the first impurity region 19 in accordance with the first prior art.

In accordance with the second prior art, as compared with the first prior art, stress is not concentrated between the isolation layer 42 and the P well 40 serving as the guard ring because the isolation layer 42 is in contact with the P well 40 (see reference numeral A of FIG. 3 and FIG. 4A), and the generation of a leakage current due to the big difference between the impurity doping concentrations of the deep well 32 and the P well 40 may be reduced because the P well 40 has an impurity doping concentration lower than that of the guard ring 20 in accordance with the first prior art. For reference, FIG. 4A is a simulation image illustrating stress concentration between the isolation layer and the guard ring, and is a comparison image of the first prior art and the second prior art.

However, in the Schottky diode in accordance with the second prior art, as shown in reference numeral C of FIG. 3 and FIG. 4A, stress is concentrated at the boundary surface of the N well 36 and the P well 40, resulting in the reduction of the breakdown voltage of the Schottky diode. For reference, FIG. 4B is a current-voltage graph illustrating a comparison of the breakdown voltage of the Schottky diode in accordance with the first prior art and the breakdown voltage of the Schottky diode in accordance with the second prior art. Referring to FIG. 4B, it may be understood that the breakdown voltage of the Schottky diode in accordance with the first prior art is approximately 25.3 V, but the breakdown voltage of the Schottky diode in accordance with the second prior art is reduced to approximately 21.6 V.

Furthermore, in accordance with the second prior art, as shown in reference numeral B of FIG. 3 and FIGS. 4C and 4D, since the P well 40 serving as the guard ring is coupled to the N well 36 coupled to the cathode electrode 37, the current path from the anode electrode 41 to the cathode electrode 37 is increased (or lengthened) as compared with the first prior art, resulting in the deterioration of the forward characteristics of the Schottky diode. For reference, FIG. 4C is an image illustrating a comparison of the current path of the Schottky diode in accordance with the first prior art and the current path of the Schottky diode in accordance with the second prior art. FIG. 4D is a current-voltage graph illustrating the forward characteristics of the Schottky diode in accordance with the first prior art and the Schottky diode in accordance with the second prior art.

In brief, it is necessary to provide a Schottky diode capable of ensuring forward characteristics, leakage current characteristics, and breakdown voltage characteristics and simultaneously achieving uniform characteristics according to dies/wafers, and a method for fabricating the same.

SUMMARY OF THE INVENTION

An embodiment of the present invention is directed to provide a Schottky diode capable of ensuring forward characteristics, leakage current characteristics, and breakdown voltage characteristics and simultaneously achieving uniform characteristics according to dies/wafers, and a method for fabricating the same.

In accordance with an embodiment of the present invention, a Schottky diode includes: a deep well formed in a substrate; an isolation layer formed in the substrate; a first conductive type guard ring formed in the deep well along an outer sidewall of the isolation layer and located at a left side of the isolation layer; a second conductive type well formed in the deep well along the outer sidewall of the isolation layer and located at a right side of the isolation layer; an anode electrode formed over the substrate and coupled to the deep well and the guard ring; and a cathode electrode formed over the substrate and coupled to the well, wherein a part of the guard ring overlaps the isolation layer.

The isolation layer may have a ring shape.

The guard ring may have a depth smaller than a depth of the isolation layer on a basis of an upper surface of the substrate.

The isolation layer may have a depth smaller than a depth of the well on the basis of the upper surface of the substrate. The lower portion of the well may surround a part of a lower surface of the isolation layer.

An impurity doping concentration of the well may be reduced in a depth direction from a surface of the substrate. The well may include: a second conductive type third impurity region being in contact with the cathode electrode; a second conductive type second impurity region formed on a lower portion of the third impurity region; and a second conductive type first impurity region formed on a lower portion of the second impurity region, wherein the third impurity region may have the highest impurity doping concentration and the first impurity region may have the lowest impurity doping concentration.

The anode electrode and the cathode electrode may include a metal silicide layer.

The first conductive type and the second conductive type may be complementary to each other, the first conductive type may be a P type, and the second conductive type may be an N type.

In accordance with another embodiment of the present invention, a method for fabricating a Schottky diode includes: forming an isolation layer having a ring shape in a substrate in which a second conductive type deep well is formed; forming a second conductive type well in the deep well along an outer sidewall of the isolation layer to be located at a right side of the isolation layer; forming a first conductive type guard ring in the deep well along the outer sidewall of the isolation layer to be located at a left side of the isolation layer in such a manner that a part of the guard ring overlaps the isolation layer; and forming an anode electrode over the substrate to be coupled to the deep well and the guard ring and simultaneously forming a cathode electrode coupled to the well over the substrate.

The isolation layer may be formed to have a ring shape.

The guard ring may have a depth smaller than a depth of the isolation layer.

The well may have a depth larger than a depth of the isolation layer. A lower portion of the well may surround a part of a lower surface of the isolation layer.

An impurity doping concentration of the well may be reduced in a depth direction from a surface of the substrate. The forming of the well may include: forming an ion implantation mask over the substrate to expose the deep well of an outer side of the isolation layer; forming a first impurity region in the deep well by ion-implanting a second conductive type impurity by using the ion implantation mask as an ion implantation barrier; forming a second impurity region on an upper portion of the first impurity region by ion-implanting the second conductive type impurity by using the ion implantation mask as an ion implantation barrier, the second impurity region having an impurity doping concentration higher than an impurity doping concentration of the first impurity region; and forming a third impurity region on an upper portion of the second impurity region by ion-implanting the second conductive type impurity by using the ion implantation mask as an ion implantation barrier, the third impurity region having an impurity doping concentration higher than an impurity doping concentration of the second impurity region.

The forming of the guard ring may include: forming an ion implantation mask over the substrate to expose the deep well of the left side of the isolation layer and a part of the isolation layer being in contact with the deep well; and ion-implanting a first conductive type impurity by using the ion implantation mask as an ion implantation barrier.

The forming of the anode electrode and the cathode electrode may include: depositing a metal layer over a resultant structure including the substrate; forming a metal silicide layer by reacting the substrate with the metal layer through a thermal treatment process; and removing a metal layer which does not react in the thermal treatment process.

BRIEF DESCRIPTION OF THE DRAWINGS

FIGS. 7A to 7D are cross-sectional views illustrating Schottky diodes for comparison, wherein FIG. 7A is a cross-sectional view illustrating a Schottky diode in accordance with a first prior art, FIG. 7B is a cross-sectional view illustrating a Schottky diode in accordance with a second prior art (1), FIG. 7C is a cross-sectional view illustrating a Schottky diode in accordance with a second prior art (2), and FIG. 7D is a cross-sectional view illustrating a Schottky diode in accordance with one embodiment of the present invention.

DESCRIPTION OF SPECIFIC EMBODIMENTS

Figure 1:
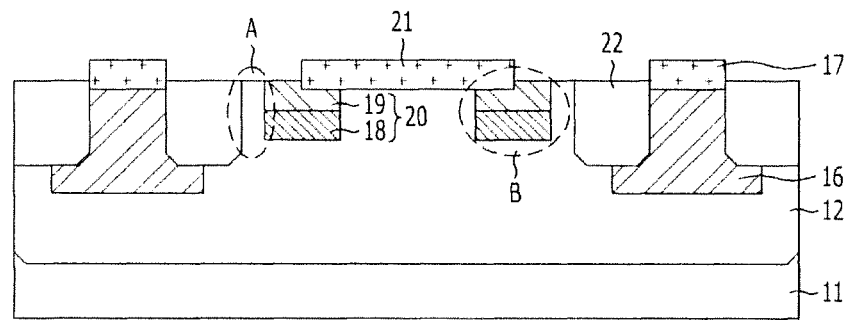
FIG. 1 is a cross-sectional view illustrating a Schottky diode in accordance with a first prior art.
Figure 2A:
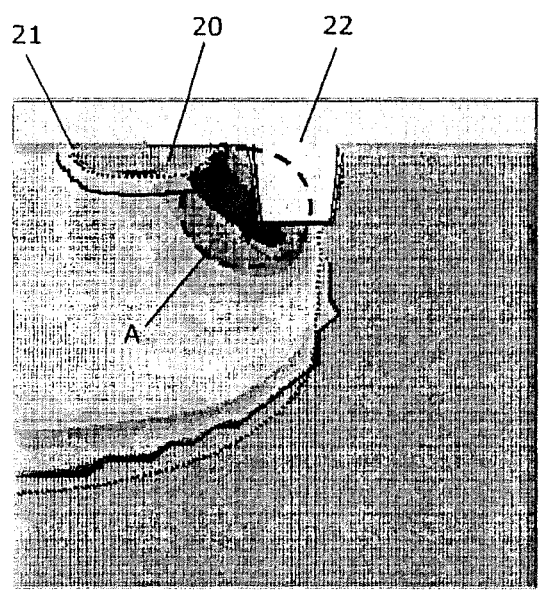
FIG. 2A is a simulation image illustrating stress concentration between an isolation layer and a guard ring of a Schottky diode in accordance with a first prior art.
Figure 2B:
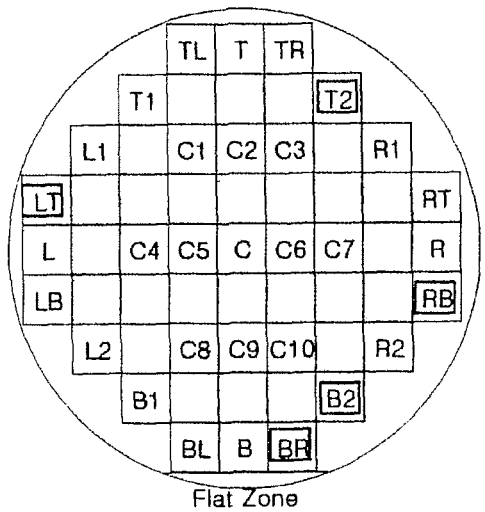
FIG. 2B is a current-voltage graph illustrating leakage current characteristics according to dies of a Schottky diode in accordance with a first prior art.
Figure 2B:
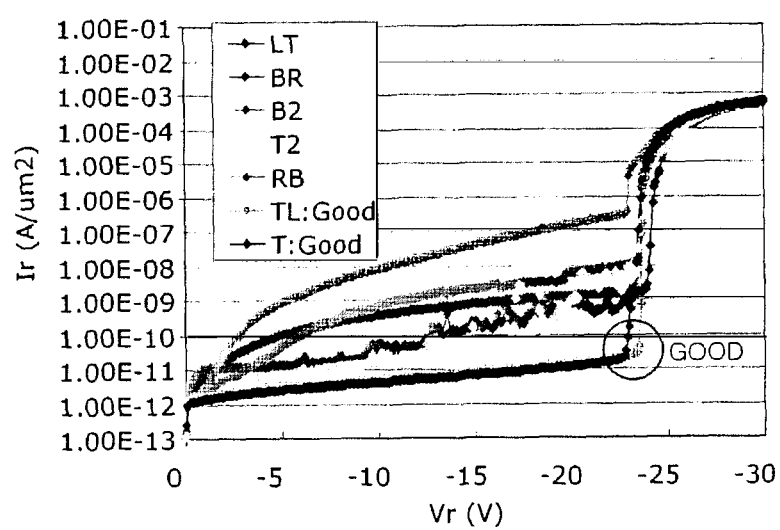
Figure 3:
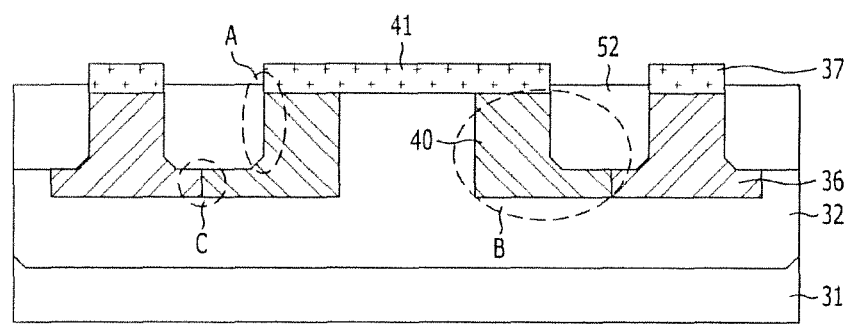
FIG. 3 is a cross-sectional view illustrating a Schottky diode in accordance with a second prior art.
Figure 4A:
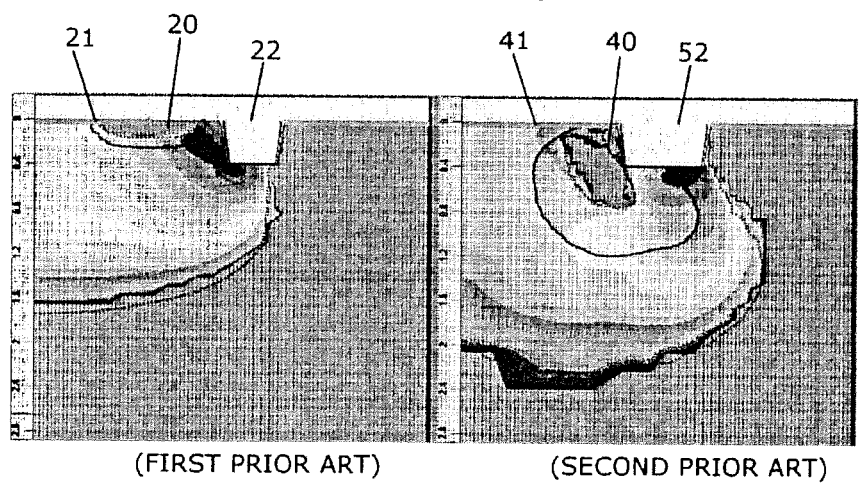
FIG. 4A is an image illustrating stress concentration between an isolation layer and a guard ring, and is a comparison image of a Schottky diode in accordance with a first prior art and a Schottky diode in accordance with a second prior art.
Figure 4B:
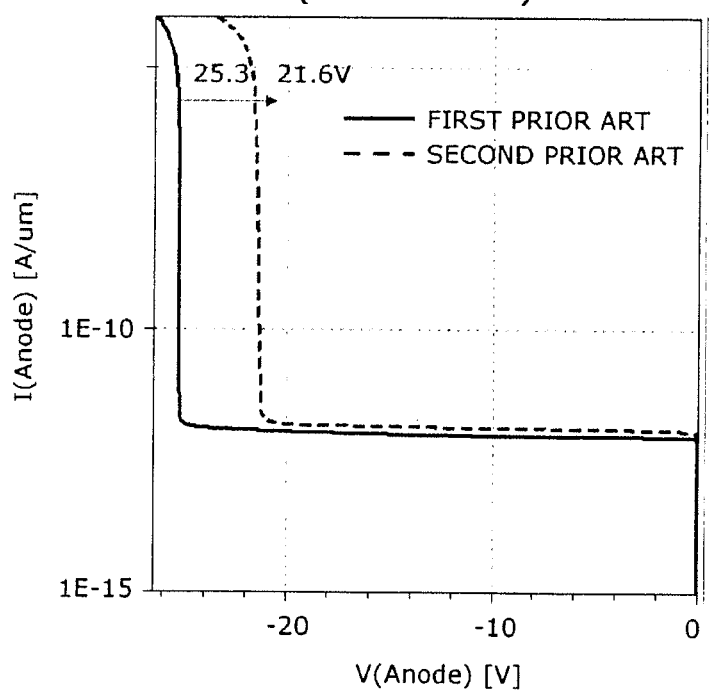
FIG. 4B is a current-voltage graph illustrating a comparison of a breakdown voltage of a Schottky diode in accordance with a first prior art and a breakdown voltage of a Schottky diode in accordance with a second prior art.
Figure 4C:
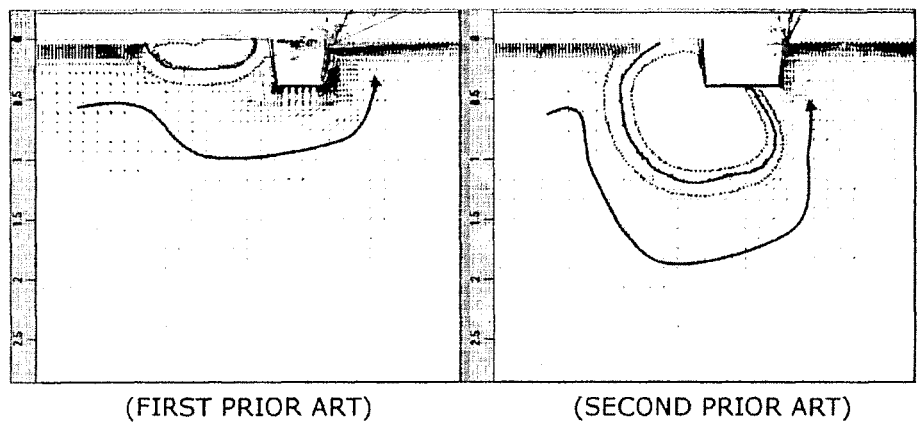
FIG. 4C is an image illustrating a comparison of a current path between an anode electrode and a cathode electrode in a Schottky diode in accordance with a first prior art and a current path between an anode electrode and a cathode electrode in a Schottky diode in accordance with a second prior art.
Figure 4D:
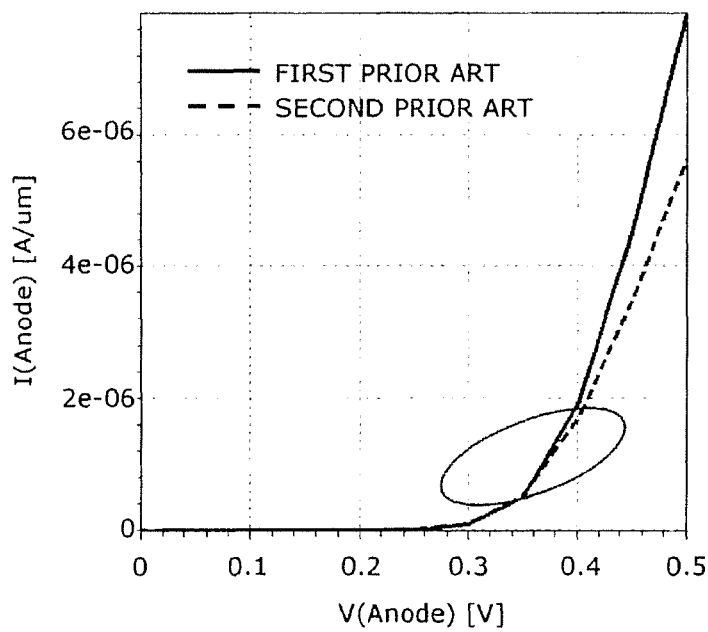
FIG. 4D is a current-voltage graph illustrating forward characteristics of a Schottky diode in accordance with a first prior art and a Schottky diode in accordance with a second prior art.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The embodiment of the present invention provides a Schottky diode capable of ensuring forward characteristics, leakage current characteristics, and breakdown voltage characteristics and simultaneously allowing these characteristics to be uniform according to dies/wafers, and a method for fabricating the same.

In accordance with an embodiment of the present invention, a first conductive type and a second conductive type are complementary to each other, the first conductive type is a P type and the second conductive type is an N type. Of course, when the first conductive type is an N type, the second conductive type may be a P type.

Figure 5A:
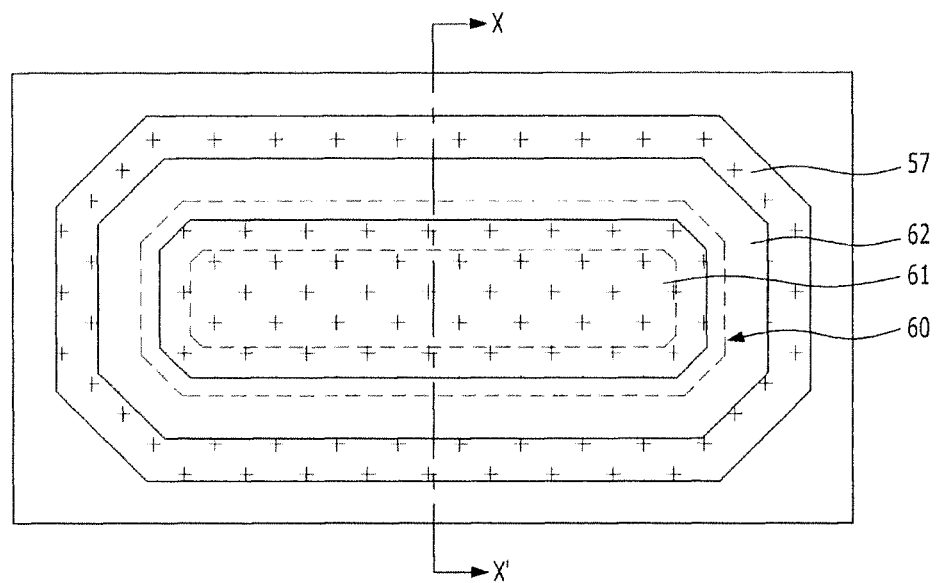
FIG. 5A is a plan view illustrating a Schottky diode in accordance with one embodiment of the present invention.
Figure 5B:
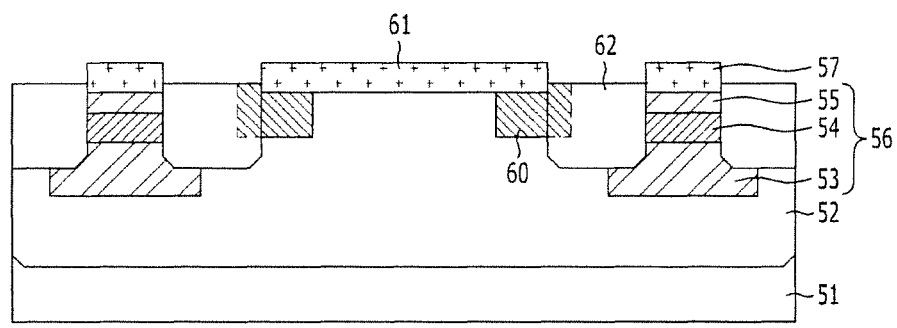
FIG. 5B is a cross-sectional view of a Schottky diode in accordance with one embodiment of the present invention, which is taken along line X-X' shown in FIG. 5A.

FIGS. 5A and 5B are diagrams illustrating a Schottky diode in accordance with the embodiment of the present invention, wherein FIG. 5A is a plan view illustrating the Schottky diode and FIG. 5B is a cross-sectional view taken along line X-X' shown in FIG. 5A.

Referring to FIGS. 5A and 5B, the Schottky diode in accordance with the embodiment of the present invention includes a second conductive type deep well 52 formed in a substrate 51, an isolation layer 62 formed in the substrate 51 and having a ring shape, a first conductive type guard ring 60, a second conductive type well 56, an anode electrode 61, and a cathode electrode 57. The first conductive type guard ring 60 is formed in the deep well 52 along the outer sidewall of the isolation layer 62 and is located at the left side of the isolation layer 62. The second conductive type well 56 is formed in the deep well 52 along the outer sidewall of the isolation layer 62 and is located at the right side of the isolation layer 62. The anode electrode 61 is formed on the substrate 51 and coupled to the deep well 52 and the guard ring 60. The cathode electrode 57 is formed on the substrate 51 and coupled to the well 56. The Schottky diode in accordance with the embodiment of the present invention is characterized in that a part of the guard ring 60 overlaps the isolation layer 62.

The guard ring 60 partially overlapping the isolation layer 62 is an impurity region formed by ion-implanting an impurity into the substrate 51. The overlap structure of the guard ring 60 and the isolation layer 62 is achieved by forming the guard ring 60 by using an ion implantation mask which simultaneously exposes a part of the deep well 52 and a part of an inner side of the isolation layer 62 being in contact with the deep well 52. This is for substantially preventing stress from being concentrated between the isolation layer 62 and the guard ring 60 by forming a contact structure of the isolation layer 62 and the guard ring 60 even if a process error occurs in the process of forming the guard ring 60, for example, the ion implantation mask is misaligned.

Furthermore, in order to suppress the generation of a leakage current due to the difference between the impurity doping concentrations of the deep well 52 and the guard ring 60 and simultaneously substantially prevent a breakdown voltage of the Schottky diode from being reduced by the guard ring 60, the guard ring 60 may be formed such that the difference between the impurity doping concentrations of the deep well 52 and the guard ring 60 is minimized if the characteristics of the guard ring 60 may be ensured. As one example, the guard ring 60 may have an impurity doping concentration of approximately $1 \times 10^{19}$ atoms/cm$^3$ to approximately $5 \times 10^{20}$ atoms/cm$^3$, and the deep well 52 may have an impurity doping concentration of approximately $1 \times 10^{14}$ atoms/cm$^3$ to approximately $1 \times 10^{19}$ atoms/cm$^3$. For reference, when it is assumed that the impurity doping concentration of the deep well 52 is constant, the guard ring in accordance with the first prior art and the guard ring in accordance with the second prior art have an impurity doping concentration of $10^{21}$ atoms/cm$^3$ or more. That is, the guard rings in accordance with the prior arts have an impurity doping concentration higher than that of the guard ring 60 in accordance with the embodiment of the present invention.

The guard ring 60 may have a depth smaller than that of the isolation layer 62 on the basis of the upper surface of the substrate 51. This is for substantially preventing the forward characteristics of the Schottky diode from being deteriorated due to the increase in a current path from the anode electrode 61 to the cathode electrode 57.

The well 56 may have a depth larger than that of the isolation layer 62 on the basis of the upper surface of the substrate 51. This is for facilitating the formation of the current path between the anode electrode 61 and the cathode electrode 57, that is, for improving the forward characteristics of the Schottky diode. For example, when the well 56 has a depth smaller than that of the isolation layer 62 on the basis of the upper surface of the substrate 51, since the current path from the anode electrode 61 to the cathode electrode 57 is increased, the forward characteristics of the Schottky diode may be deteriorated.

In addition, in order to improve the forward characteristics of the Schottky diode, the lower portion of the well 56 may surround a part of a lower surface of the isolation layer 62.

The well 56 coupled to the cathode electrode 57 includes a second conductive-type first impurity region 53, a second conductive-type third impurity region 55, and a second conductive-type second impurity region 54. The second conductive-type first impurity region 53 has a depth larger than that of the isolation layer 62 on the basis of the upper surface of the substrate 51. The second conductive-type third impurity region 55 is formed on the surface of the substrate 51 and is in contact with the cathode electrode 57. The second conductive-type second impurity region 54 is interposed between the first impurity region 53 and the third impurity region 55. That is, the well 56 has a structure in which the third impurity region 55, the second impurity region 54, and the first impurity region 53 are sequentially stacked in the depth direction from the surface of the substrate 51. The impurity doping concentration of the well 56 may be reduced in the depth direction from the surface of the substrate 51 in order to improve the breakdown voltage and the forward characteristics of the Schottky diode and simultaneously reduce a contact resistance with the cathode electrode 57. As one example, the first impurity region 53 may have an impurity doping concentration of approximately $1 \times 10^{14}$ atoms/cm$^3$ to approximately $1 \times 10^{19}$ atoms/cm$^3$, the second impurity region 54 may have an impurity doping concentration of approximately $1 \times 10^{19}$ atoms/cm$^3$ to approximately $5 \times 10^{20}$ atoms/cm$^3$, and the third impurity region 55 may have an impurity doping concentration of approximately $5 \times 10^{20}$ atoms/cm$^3$ to approximately $5 \times 10^{21}$ atoms/cm$^3$.

The substrate 21 may include a silicon substrate, and the anode electrode 61 and the cathode electrode 57 may include a metal silicide layer, for example, a cobalt silicide layer CoSi. The isolation layer 62 may be formed through a shallow trench isolation (STI) process. Furthermore, the isolation layer 62 includes a ring-shaped isolation layer, which is located between the guard ring 60 and the well 56 to electrically isolate the guard ring 60 from the well 56, and an isolation layer which surrounds the whole of the Schottky diode including the well 56.

The Schottky diode having the above structure in accordance with the embodiment of the present invention may ensure the forward characteristics, backward characteristics (or leakage current characteristics), and breakdown voltage characteristics and simultaneously allow these characteristics to be uniform according to dies/wafers (see FIGS. 7A to 7D and FIGS. 8A to 8G).

In detail, in the Schottky diode in accordance with the embodiment of the present invention, since the guard ring 60 has a depth smaller than that of the isolation layer 62 and the well 56 coupled to the cathode electrode 57 has a depth larger than that of the isolation layer 62 on the basis of the upper surface of the substrate 51, the current path between the anode electrode 61 and the cathode electrode 57 is substantially prevented from being increased, resulting in the improvement of the forward characteristics of the Schottky diode. In addition, the well 56 has a structure in which the first impurity region 53, the second impurity region 54, and the third impurity region 55 are stacked such that the impurity doping concentration is reduced in the depth direction from the surface of the substrate 51, so that the forward characteristics of the Schottky diode may be further improved.

Furthermore, in the Schottky diode in accordance with the embodiment of the present invention, since the guard ring 60 partially overlaps the isolation layer 62, stress is substantially prevented from being concentrated at a boundary region of the guard ring 60 and the isolation layer 62, so that the generation of the leakage current due to stress concentration may be substantially prevented. Furthermore, the guard ring 60 and the well 56, which have conductive types complementary to each other, are not in contact with each other, so that the generation of the leakage current due to stress concentration at an interface between the guard ring 60 and the well 56 may be substantially prevented. Furthermore, the difference between the impurity doping concentrations of the guard ring 60 and the deep well 52 is minimized, so that the generation of the leakage current due to the difference between the impurity doping concentrations thereof may be substantially prevented.

Moreover, in the Schottky diode in accordance with the embodiment of the present invention, the difference between the impurity doping concentrations of the guard ring 60 and the deep well 52 is minimized, so that the reduction in a breakdown voltage of the Schottky diode due to the difference between the impurity doping concentrations thereof may be substantially prevented. Moreover, the guard ring 60 and the well 56, which have conductive types complementary to each other, are not in contact with each other, so that the reduction in the breakdown voltage of the Schottky diode may be substantially and effectively prevented. Moreover, the well 56 has a structure in which the first impurity region 53, the second impurity region 54, and the third impurity region 55 are stacked such that the impurity doping concentration is reduced in the depth direction from the surface of the substrate 51, so that the reduction in the breakdown voltage of the Schottky diode may be more substantially and more effectively prevented.

In addition, in the Schottky diode in accordance with the embodiment of the present invention, the above-described characteristics may be stably achieved and may be uniform according to dies/wafers. This may be more clearly understood with reference to FIGS. 8B to 8E.

FIGS. 6B to 6E are cross-sectional views illustrating the method for fabricating the Schottky diode in accordance with the embodiment of the present invention, which is taken along line X-X' shown in FIG. 5A.

Figure 6A:
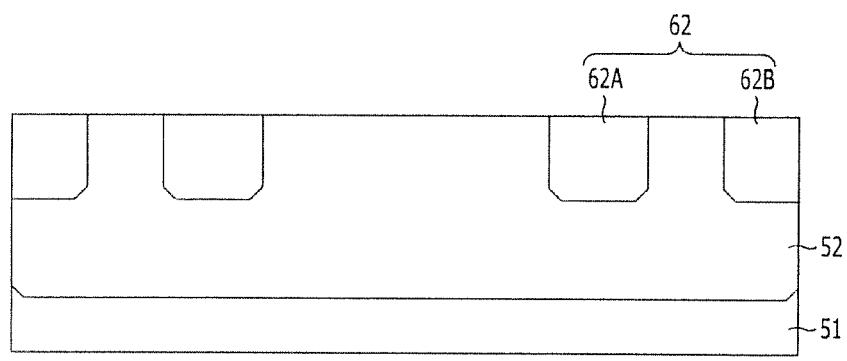
FIGS. 6B to 6E are cross-sectional views illustrating a method for fabricating a Schottky diode in accordance with one embodiment of the present invention, which is taken along line X-X' shown in FIG. 5A.

Referring to FIG. 6A, the second conductive type deep well 52 is formed by ion-implanting an impurity into the substrate 51. When the second conductive type is an N type, the deep well 52 may be formed by ion-implanting phosphorous (P), arsenic (As) and the like, and may have an impurity doping concentration of approximately $1 \times 10^{14}$ atoms/cm$^3$ to approximately $1 \times 10^{19}$ atoms/cm$^3$.

The isolation layer 62 having a ring shape is formed on the substrate 51 in which the deep well 52 is formed. The isolation layer 62 may be formed through a shallow trench isolation (STI) process. The isolation layer 62 may include a first isolation layer 62A and a second isolation layer 62B. The first isolation layer 62A defines an area, in which an anode electrode and a guard ring are to be formed through subsequent processes, and has a ring shape. The second isolation layer 62B defines an area, in which a cathode electrode and a well are to be formed through subsequent processes, together with the first isolation layer 62A, and surrounds the first isolation layer 62A at the outer side of the first isolation layer 62A. The second isolation layer 62B also isolates an adjacent Schottky diode.

Figure 6B:
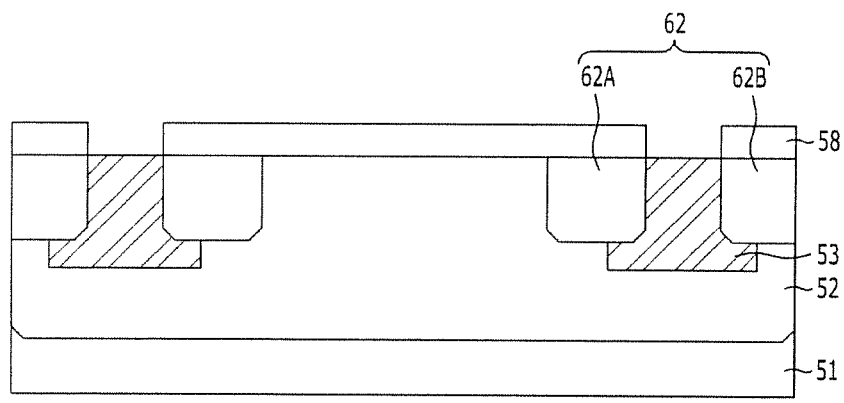

Referring to FIG. 6B, a first ion implantation mask 58 is formed on the substrate 51 to expose the deep well 52 between the first isolation layer 62A and the second isolation layer 62B, that is, the substrate 51 including the area in which the cathode electrode is to be formed. The first ion implantation mask 58 may include photo resist (PR).

The second conductive-type first impurity region 53 is formed by ion-implanting an impurity into the deep well 52 by using the first ion implantation mask 58 as an ion implantation barrier. The first impurity region 53 serves as a part of the well coupled to the cathode electrode through subsequent processes.

The first impurity region 53 may have a depth larger than that of the isolation layer 62 on the basis of the upper surface of the substrate 51 in order to improve the forward characteristics of the Schottky diode. The depth of the first impurity region 53 may be adjusted through ion-implanting energy. In addition, in order to further improve the forward characteristics of the Schottky diode, the lower portion of the first impurity region 53 may surround a part of the lower surface of the isolation layer 62. This may be achieved through a thermal treatment process for activating the first impurity region 53, and by taking the degree of diffusion of the impurity according to the thermal treatment process into consideration.

In order to improve the breakdown voltage of the Schottky diode, the first impurity region 53 may have an impurity doping concentration similar to that of the deep well 52, for example, an impurity doping concentration of approximately $1 \times 10^{14}$ atoms/cm$^3$ to approximately $1 \times 10^{19}$ atoms/cm$^3$.

Figure 6C:
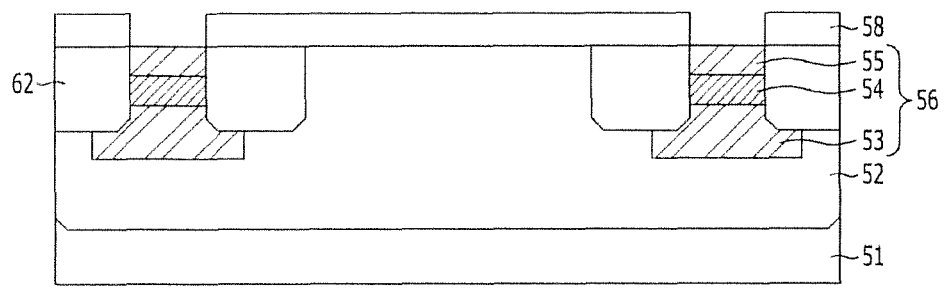

Referring to FIG. 6C, after the first impurity region 53 is formed by using the first ion implantation mask 58 as the ion implantation barrier, the second conductive-type second impurity region 54 and the second conductive-type third impurity region 55 are formed in the first impurity region 53. In such a case, on the basis of the upper surface of the substrate 51, the first impurity region 53 has the largest depth, the third impurity region 55 has the smallest depth, and the second impurity region 54 is located between the first impurity region 53 and the third impurity region 55.

The second impurity region 54 may have an impurity doping concentration of approximately $1 \times 10^{19}$ atoms/cm$^3$ to approximately $5 \times 10^{20}$ atoms/cm$^3$, and the third impurity region 55 may have an impurity doping concentration of approximately $5 \times 10^{20}$ atoms/cm$^3$ to approximately $5 \times 10^{21}$ atoms/cm$^3$. The depths of the second impurity region 54 and the third impurity region 55 may be adjusted through ion implantation energy.

Through the above-described processes, it may be possible to form the second conductive-type well 56 having the stack structure of the first impurity region 53, the second impurity region 54 and the third impurity region 55.

Figure 6D:
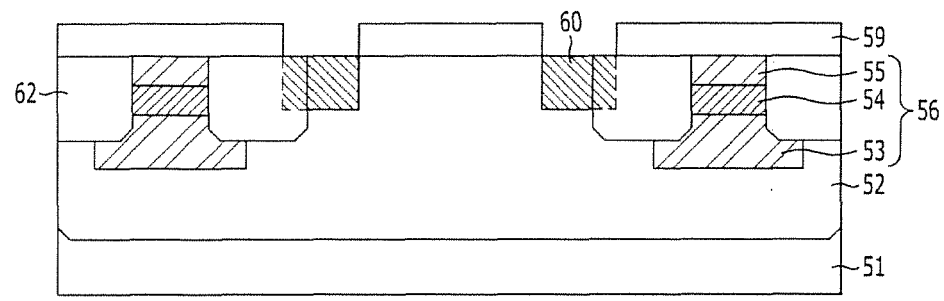

Referring to FIG. 6D, the first ion implantation mask 58 is removed, and a second ion implantation mask 59 is formed on the substrate 51 to expose the area in which the guard ring is to be formed. The second ion implantation mask 59 may have an opening which exposes a part of an inner side of the isolation layer 62 (that is, a part of an inner side of the isolation layer 62A) and a part of the deep well 52 being in contact with an outer sidewall of the isolation layer 62A. The second ion implantation mask 59 may include photo resist (PR).

The reason for forming the second ion implantation mask 59 such that the opening thereof exposes the part of the inner side of the isolation layer 62 is to substantially prevent a process error, for example, to substantially prevent the guard ring to be formed through subsequent processes from being spaced apart from the isolation layer 62 due to misalignment.

The first conductive type guard ring 60 is formed by ion-implanting an impurity into the deep well 52 by using the second ion implantation mask 59 as an ion implantation barrier. The guard ring 60 may be formed to have a depth smaller than that of the isolation layer 62 on the basis of the upper surface of the substrate 51 in order to improve the forward characteristics of the Schottky diode.

Furthermore, the guard ring 60 may be formed such that the difference between the impurity doping concentrations of the guard ring 60 and the deep well 52 is minimized in order to ensure the breakdown voltage characteristics and the leakage current characteristics the Schottky diode. For example, the guard ring 60 may have an impurity doping concentration of approximately $1 \times 10^{19}$ atoms/cm$^3$ to approximately $5 \times 10^{20}$ atoms/cm$^3$.

Figure 6E:
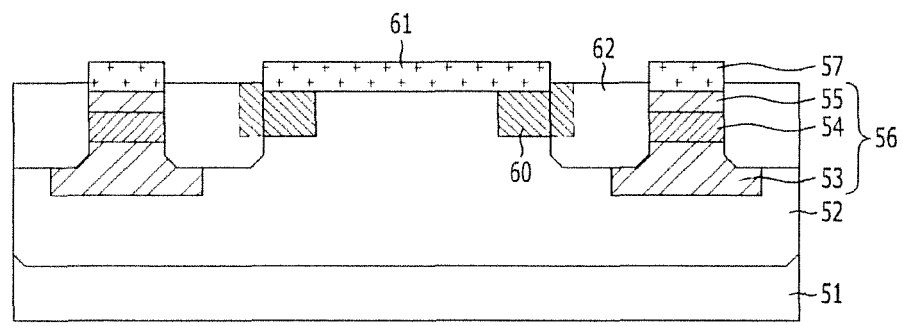

Referring to FIG. 6E, the second ion implantation mask 59 is removed, and a metal layer (not shown) is deposited on a resultant structure including the substrate 51 in order to form the anode electrode 61 and the cathode electrode 57. The metal layer is subject to a thermal treatment process to simultaneously form the anode electrode 61 and the cathode electrode 57, which include a silicide layer, through a reaction between the substrate 51 (for example, a silicon substrate) and the metal layer. A remaining metal layer, which does not react during the thermal treatment process, is removed.

The anode electrode 61 covers a resultant structure including the substrate 51 between the isolation layers 62 and may be coupled to the deep well 52 and the guard ring 60. The cathode electrode 57 is located at an outer side of the isolation layers 62 and above the isolation layers 62, and may be coupled to the well 56.

Through the above-described processes, the Schottky diode in accordance with the embodiment of the present invention may be formed.

Hereinafter, the characteristics of the Schottky diode in accordance with the embodiment of the present invention will be described in detail. In order to facilitate the understanding of the characteristics of the Schottky diode in accordance with the embodiment of the present invention, a comparison with the characteristics of the Schottky diode in accordance with the first prior art and the second prior art is used.

Figure 7A:
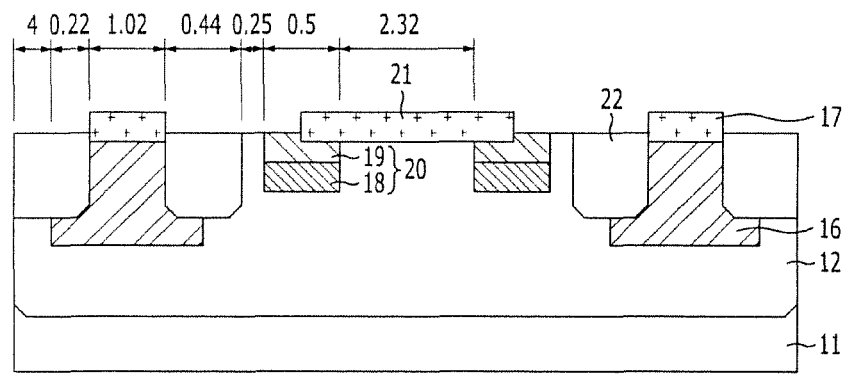
Figure 7B:
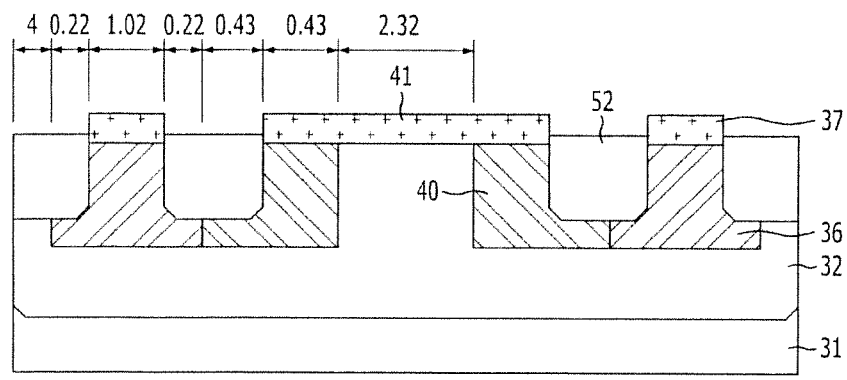
Figure 7C:
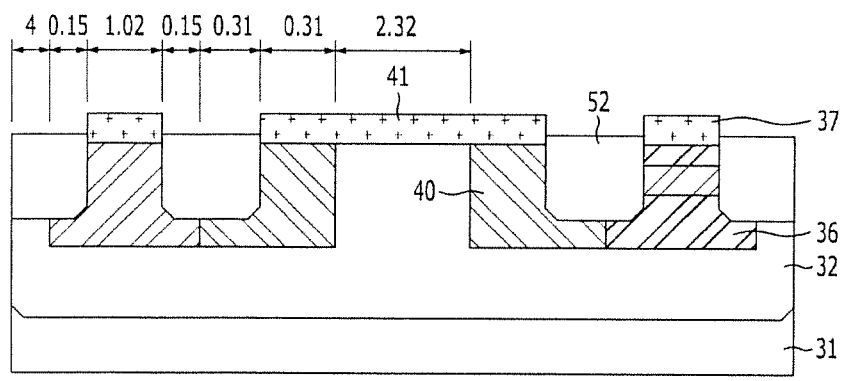
Figure 7D:
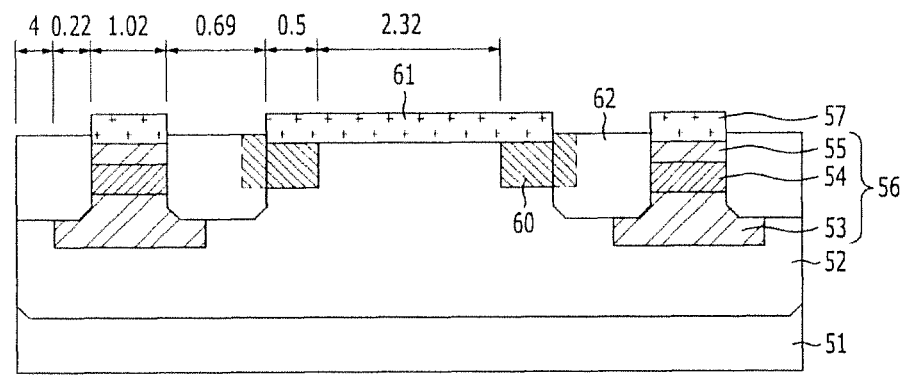

FIG. 7A is a cross-sectional view illustrating the Schottky diode in accordance with the first prior art, FIGS. 7B and 7C are cross-sectional views illustrating the Schottky diode in accordance with the first prior art, and FIG. 7D is a cross-sectional view illustrating the Schottky diode in accordance with the embodiment of the present invention. FIGS. 7A to 7D illustrate the Schottky diodes fabricated in order to compare the Schottky diode in accordance with the prior arts with the Schottky diode in accordance with the embodiment of the present invention, and the unit of numerical values written at the upper portions of FIGS. 7A to 7D is μm. The Schottky diode shown in FIG. 7B has the same elements as those of the Schottky diode shown in FIG. 7C, except for the line widths among the elements. For the purpose of convenience, the Schottky diode shown in FIG. 7B will be referred to as "a second prior art (1)", and the Schottky diode shown in FIG. 7C will be referred to as "a second prior art (2)".

Figure 8A:
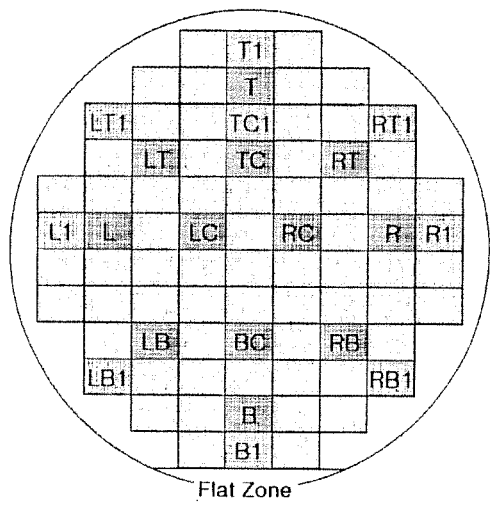
FIG. 8A is a wafer map illustrating the distribution of dies on a wafer in which the characteristics of Schottky diodes in accordance with the prior arts and one embodiment of the present invention are measured.
Figure 8B:
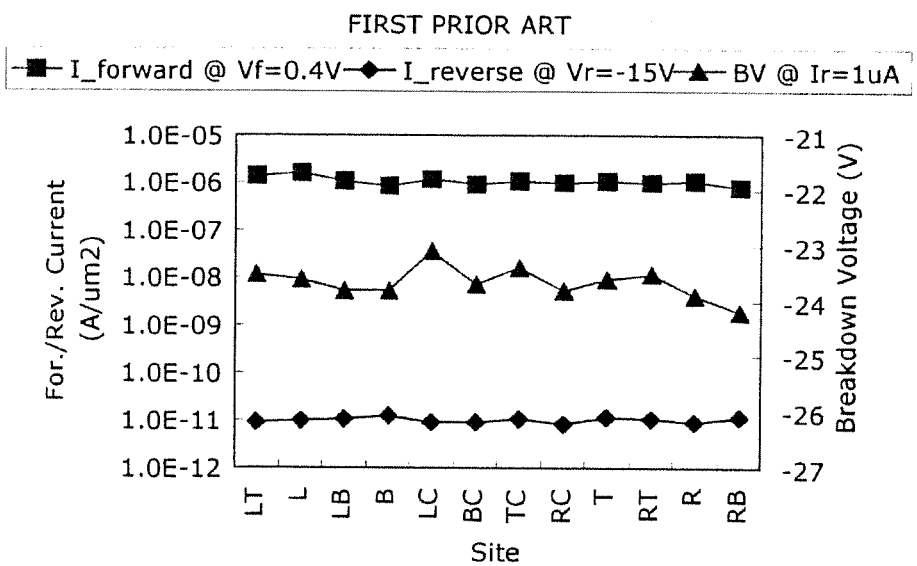
FIGS. 8B to 8G are graphs illustrating the characteristics of Schottky diodes in accordance with the prior arts and one embodiment of the present invention.
Figure 8C:
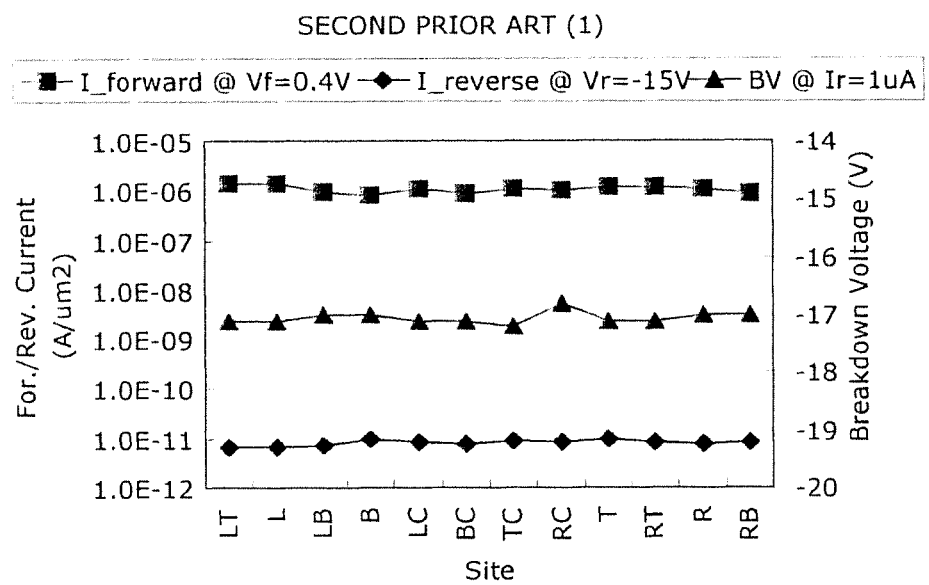
Figure 8D:
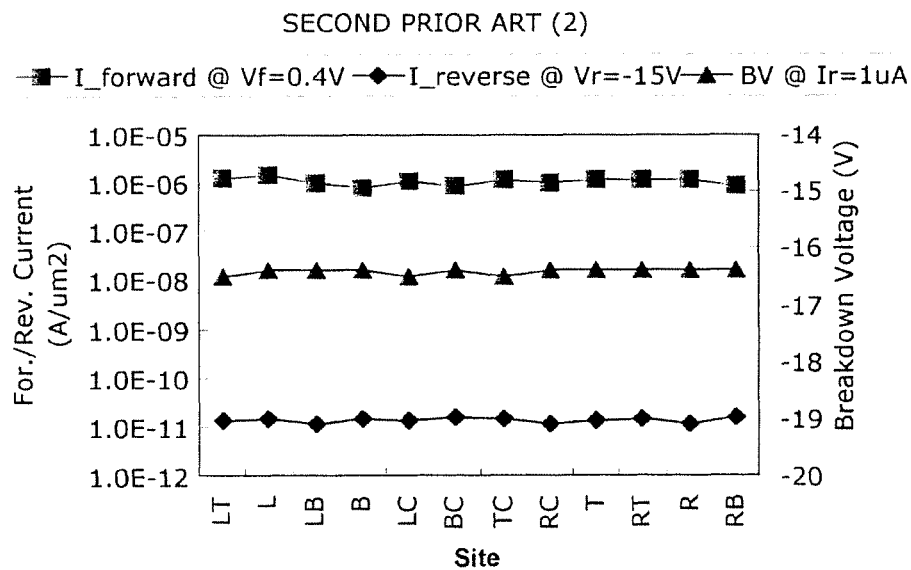
Figure 8E:
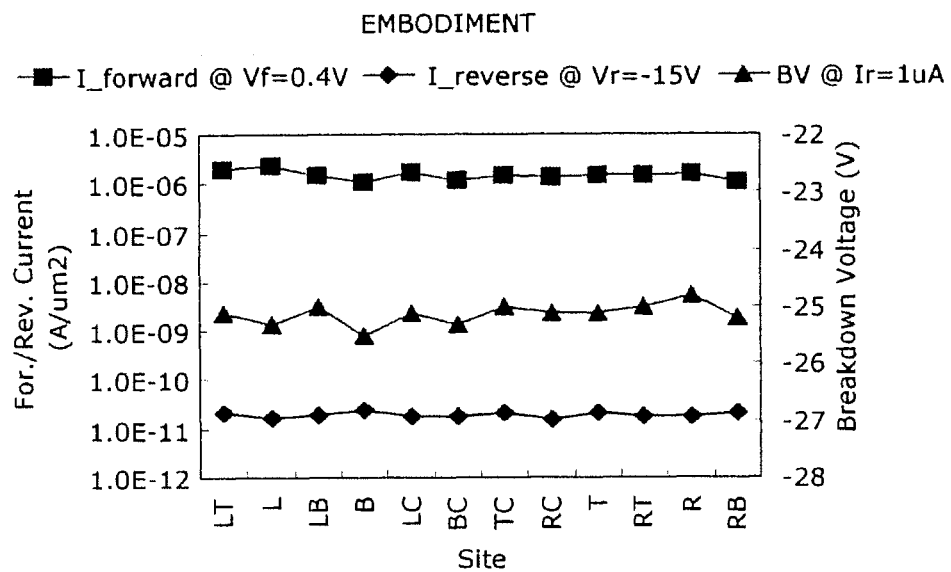
Figure 8F:
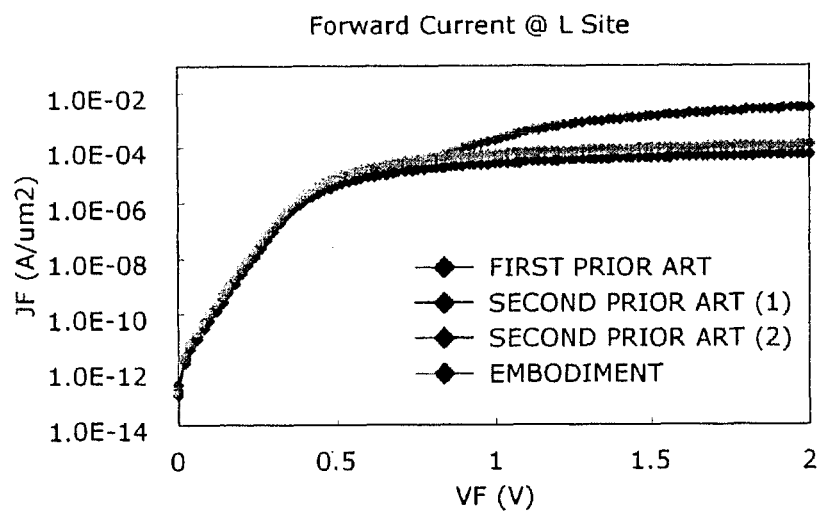
Figure 8G:
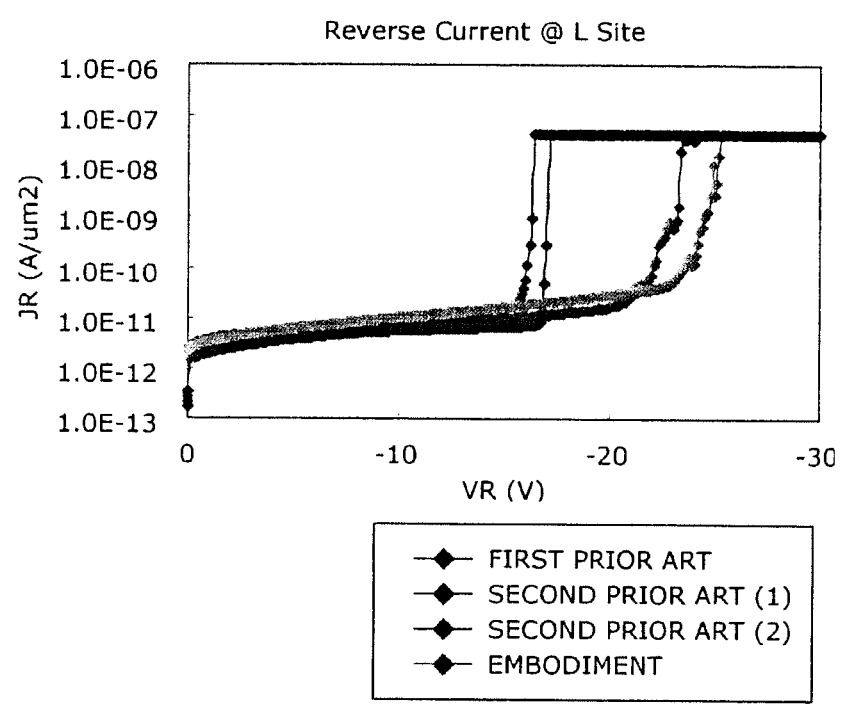

FIG. 8A is a wafer map illustrating dies on a wafer in which the characteristics of the Schottky diodes are measured, and FIGS. 8B to 8G are graphs illustrating the characteristics of the Schottky diodes shown in FIGS. 7A to 7D.

When comparing the forward characteristics of the Schottky diodes in accordance with the prior arts with the forward characteristics of the Schottky diode in accordance with the embodiment of the present invention with reference to FIGS. 8B to 8G, it may be understood that the Schottky diode in accordance with the embodiment of the present invention has the best characteristics. Particularly, in terms of the forward current characteristics, the Schottky diode in accordance with the embodiment of the present invention has the characteristics improved by an approximately 40%, as compared with the Schottky diodes in accordance with the prior arts (when Vf=approximately 0.4V).

This results from the fact that the guard ring 60 has a depth smaller than that of the isolation layer 62 and the well 56 has a depth larger than that of the isolation layer 62 on the basis of the upper surface of the substrate 51 in the Schottky diode in accordance with the embodiment of the present invention, so that the current path between the anode electrode 61 and the cathode electrode 57 may be shortened as compared with the prior arts, and the well 56 has a structure in which the first impurity region 53, the second impurity region 54, and the third impurity region 55 are stacked such that the impurity doping concentration may be reduced in the depth direction from the surface of the substrate 51.

When comparing the backward characteristics of the Schottky diodes in accordance with the prior arts with the backward characteristics of the Schottky diode in accordance with the embodiment of the present invention, the similar result (in detail, the backward characteristics of 50 pA or less) is obtained in both the prior arts and the embodiment of the present invention (when Vr=approximately 15V and approximately 20V).

When comparing the breakdown voltage characteristics of the Schottky diodes in accordance with the prior arts with the breakdown voltage characteristics of the Schottky diode in accordance with the embodiment of the present invention, it may be understood that the Schottky diode in accordance with the embodiment of the present invention has the best characteristics (in the sequence of the present invention, the first prior art, the second prior art (1), and the second prior art (2)).

This results from the fact that the guard ring 60 and the well 56, which have conductive types complementary to each other, are spaced apart from each other, and the difference between impurity doping concentrations of the deep well 52 and the guard ring 60 is minimized in the Schottky diode in accordance with the embodiment of the present invention, as compared with the prior arts. Furthermore, This results from the fact that the well 56 has a structure in which the first impurity region 53, the second impurity region 54, and the third impurity region 55 are stacked such that the impurity doping concentration is reduced in the depth direction from the surface of the substrate 51, so that the difference between impurity doping concentrations of the deep well 52 and the guard ring 60 is minimized.

For reference, the guard ring 60 is provided such that the Schottky diode controls a high current (or a high voltage). Therefore, when the impurity doping concentration of the guard ring 60 is reduced for the breakdown voltage characteristics of the Schottky diode, the forward characteristics and the backward characteristics of the Schottky diode may be deteriorated. However, as described above, the Schottky diode in accordance with the embodiment of the present invention may ensure the breakdown voltage characteristics as well as the forward characteristics and the backward characteristics.

In terms of variation in the above-described characteristics according to dies/wafers in the Schottky diodes in accordance with the prior arts and the Schottky diode in accordance with the embodiment of the present invention, it may be understood that the variation according to dies/wafers is small in the Schottky diode in accordance with the embodiment of the present invention, as compared with the prior arts.

In brief, in the Schottky diode and the method for fabricating the same in accordance with the embodiment of the present invention, forward characteristics, leakage current characteristics, and breakdown voltage characteristics may be ensured and simultaneously the above-described characteristics may be uniform according to dies/wafers.

In accordance with the embodiment of the present invention, since a guard ring has a depth smaller than that of an isolation layer and a well has a depth larger than that of the isolation layer on the basis of the upper surface of a substrate, an increase in a current path between an anode electrode and a cathode electrode is substantially prevented, resulting in the improvement of the forward characteristics of a Schottky diode.

Furthermore, in accordance with the embodiment of the present invention, first to third impurity regions are stacked such that the impurity doping concentrations thereof are reduced in the depth direction from the surface of the substrate, resulting in the improvement of the forward characteristics of the Schottky diode. In addition, a breakdown voltage of the Schottky diode may be substantially prevented from being reduced.

Furthermore, in accordance with the embodiment of the present invention, since the guard ring partially overlaps the isolation layer, stress is substantially prevented from being concentrated at a boundary region of the guard ring and the isolation layer, so that the generation of a leakage current due to stress concentration may be substantially prevented.

Furthermore, in accordance with the embodiment of the present invention, the guard ring and the well, which have conductive types complementary to each other, are not in contact with each other, so that the generation of the leakage current due to stress concentration at an interface between the guard ring and the well may be substantially prevented. In addition, the breakdown voltage of the Schottky diode may be substantially prevented from being reduced.

Furthermore, in accordance with the embodiment of the present invention, the difference between the impurity doping concentrations of the guard ring and the deep well is minimized, so that the generation of the leakage current due to the difference between the impurity doping concentrations thereof may be substantially prevented. In addition, the breakdown voltage of the Schottky diode may be substantially prevented from being reduced.

Moreover, in accordance with the embodiment of the present invention, it may be provide the Schottky diode in which the above-described characteristics are uniform according to dies/wafers.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a Schottky diode, comprising:
    forming an isolation layer in a substrate in which a deep well of a second conductive type is formed;
    forming a well region of a second conductive type in the deep well along an outer sidewall of the isolation layer to be located at one side of the isolation layer;
    forming a guard ring of a first conductive type in the deep well along the outer sidewall of the isolation layer to be located at an opposite side of the isolation layer in such a manner that a part of the guard ring overlaps the isolation layer; and
    forming an anode electrode over the substrate to be coupled to the deep well and the guard ring and simultaneously forming a cathode electrode coupled to the well region over the substrate,
    wherein an impurity doping concentration of the well region is reduced in a depth direction from a surface of the substrate,
    wherein the forming of the well region comprises:
    forming an ion implantation mask over the substrate to expose the deep well of an outer side of the isolation layer;
    forming a first impurity region in the deep well by ion implanting a second conductive type impurity by using the ion implantation mask as an ion implantation barrier;
    forming a second impurity region on an upper portion of the first impurity region by ion-implanting the second conductive type impurity by using the ion implantation mask as an ion implantation barrier, the second impurity region having an impurity doping concentration higher than an impurity doping concentration of the first impurity region; and forming a third impurity region on an upper portion of the second impurity region by ion-implanting the second conductive type impurity by using the ion implantation mask as an ion implantation barrier, the third impurity region having an impurity doping concentration higher than an impurity doping concentration of the second impurity region.

2. The method of claim 1, wherein the isolation layer is formed to have a ring shape.

3. The method of claim 1, wherein the guard ring has a depth smaller than a depth of the isolation layer.

4. The method of claim 1, wherein the well region has a depth larger than a depth of the isolation layer.

5. The method of claim 4, wherein a lower portion of the well region surrounds a part of a lower surface of the isolation layer.

6. The method of claim 1, wherein the forming of the guard ring comprises:
    forming an ion implantation mask over the substrate to expose the deep well of the opposite side of the isolation layer and a part of the isolation layer being in contact with the deep well; and
    ion-implanting a first conductive type impurity by using the ion implantation mask as an ion implantation barrier.

7. The method of claim 1, wherein the forming of the anode electrode and the cathode electrode comprises:
    depositing a metal layer over a resultant structure including the substrate;
    forming a metal silicide layer by reacting the substrate with the metal layer through a thermal treatment process; and
    removing a metal layer which does not react in the thermal treatment process.

8. A method for fabricating a Schottky diode, comprising:
    forming an isolation layer in a substrate in which a deep well of a second conductive type is formed;
    forming a well region of a second conductive type in the deep well along an outer sidewall of the isolation layer to be located at one side of the isolation layer;
    forming a guard ring of a first conductive type in the deep well along the outer sidewall of the isolation layer to be located at an opposite side of the isolation layer in such a manner that a part of the guard ring overlaps the isolation layer; and
    forming an anode electrode over the substrate to be coupled to the deep well and the guard ring and simultaneously forming a cathode electrode coupled to the well region over the substrate,
    wherein a first region of the guard ring overlaps with the isolation layer and a second region of the guard ring does not overlap with the isolation layer,
    wherein a width of a top surface of the first region is different from a width of a top surface of the second region, and
    wherein the width of a top surface of the second region is substantially the same as a width of a bottom surface of the second region.

9. The method of claim 8, wherein a n overlapping width between the guard ring and the isolation layer is smaller than a width of the guard ring not overlapping the isolation layer.

10. The method of claim 8, wherein the isolation layer has a ring shape.

11. The method of claim 8, wherein the guard ring has a depth smaller than a depth of the isolation layer on a basis of an upper surface of the substrate.

12. The method of claim 8, wherein the isolation layer has a depth smaller than a depth of the well region on the basis of the upper surface of the substrate.

13. The method of claim 12, wherein a lower portion of the well region surrounds a portion of a lower surface of the isolation layer.

14. The method of claim 8, wherein the forming of the well region comprises:
    forming an ion implantation mask over the substrate to expose the deep well of an outer side of the isolation layer;
    forming a first impurity region in the deep well by ion implanting a second conductive type impurity by using the ion implantation mask as an ion implantation barrier;
    forming a second impurity region on an upper portion of the first impurity region by ion-implanting the second conductive type impurity by using the ion implantation mask as an ion implantation barrier, the second impurity region having an impurity doping concentration higher than an impurity doping concentration of the first impurity region; and forming a third impurity region on an upper portion of the second impurity region by ion-implanting the second conductive type impurity by using the ion implantation mask as an ion implantation barrier, the third impurity region having an impurity doping concentration higher than an impurity doping concentration of the second impurity region.

15. The method of claim 8, wherein the forming of the anode electrode and the cathode electrode comprises:
    depositing a metal layer over a resultant structure including the substrate;
    forming a metal silicide layer by reacting the substrate with the metal layer through a thermal treatment process; and
    removing a metal layer which does not react in the thermal treatment process.

16. The method of claim 8, wherein the width of a top surface of the first region is smaller than the width of a top surface of the second region.

17. A method of claim 8, wherein the width of a top surface of the first region is substantially the same as a width of a bottom surface of the first region.

\* \* \* \* \*